United States Patent [19]
Lee

[11] Patent Number: 5,936,275
[45] Date of Patent: *Aug. 10, 1999

[54] HIGH DENSITY FLASH MEMORY CELL AND METHOD OF FORMING A LINE OF FLOATING GATE TRANSISTORS

[75] Inventor: Roger R. Lee, Boise, Id.

[73] Assignee: Micron Technology, Inc., Boise, Id.

[*] Notice: This patent is subject to a terminal disclaimer.

[21] Appl. No.: 08/988,852

[22] Filed: Dec. 11, 1997

Related U.S. Application Data

[60] Continuation of application No. 08/748,102, Nov. 12, 1996, Pat. No. 5,721,441, which is a division of application No. 08/675,993, Jul. 9, 1996, Pat. No. 5,658,814.

[51] Int. Cl.[6] .................................................. H01L 29/788
[52] U.S. Cl. ........................... 257/315; 257/316; 257/366
[58] Field of Search .................................. 257/315, 316, 257/366

[56] References Cited

U.S. PATENT DOCUMENTS

| | | | |
|---|---|---|---|
| 5,107,313 | 4/1992 | Kohda et al. | 357/23.5 |
| 5,306,935 | 4/1994 | Esquivel et al. | 257/315 |
| 5,330,924 | 7/1994 | Huang et al. | 437/43 |
| 5,378,646 | 1/1995 | Huang et al. | 437/47 |
| 5,566,106 | 10/1996 | Bergemont | 365/185.33 |
| 5,583,360 | 12/1996 | Roth et al. | 257/316 |
| 5,604,141 | 2/1997 | Bergemont | 437/43 |
| 5,610,419 | 3/1997 | Tanaka | 357/315 |
| 5,721,441 | 2/1998 | Lee | 257/315 |

*Primary Examiner*—Mark V. Prenty
*Attorney, Agent, or Firm*—Wells, St. John, Roberts, Gregory & Matkin P.S.

[57] ABSTRACT

A method of forming a line for floating gate transistors is described and which includes, providing a substrate having a plurality of discrete field oxide regions, and intervening active area regions therebetween; forming a first alternating series of floating gates over a first alternating series of active area regions; forming a second alternating series of floating gates over a second alternating series of active area regions, the second series of floating gates disposed in spaced, overlapping and partial covering relation relative to the first alternating series of floating gates; forming a layer of dielectric material over the first and second series of floating gates; and forming a control gate layer of electrically conductive material over the layer of dielectric material. The present invention further relates to a memory chip, and die having a line of floating gate transistors formed from the same method.

7 Claims, 4 Drawing Sheets

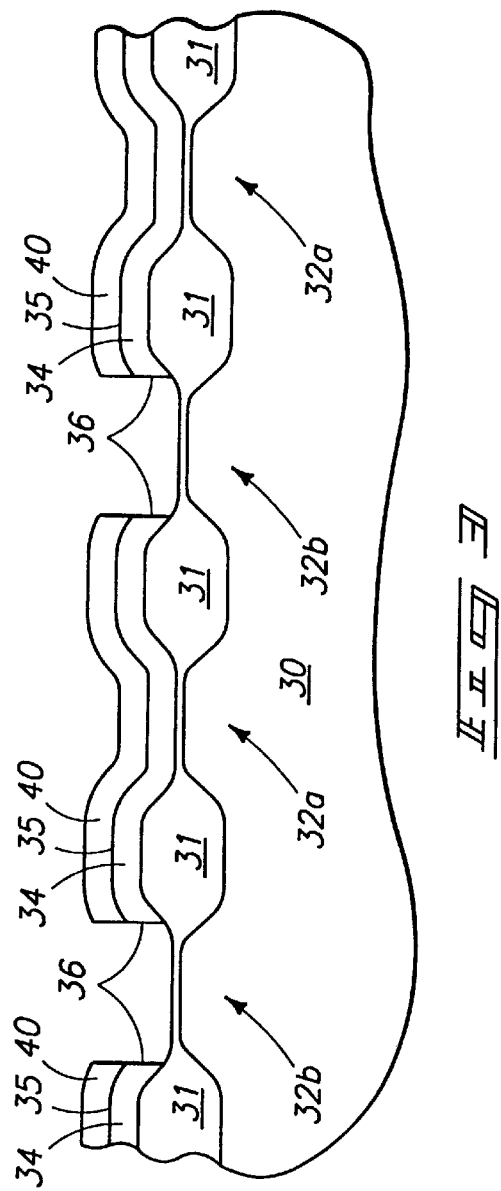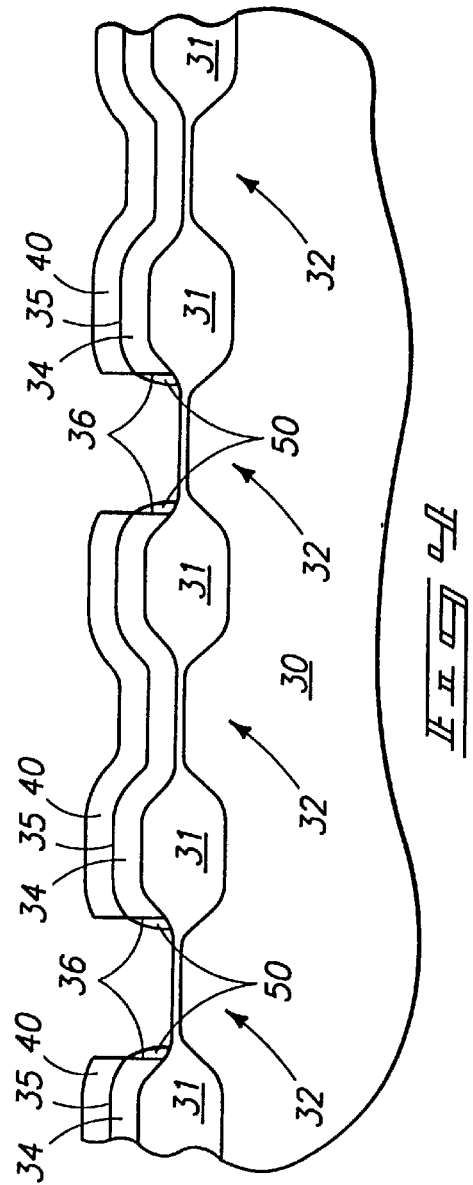

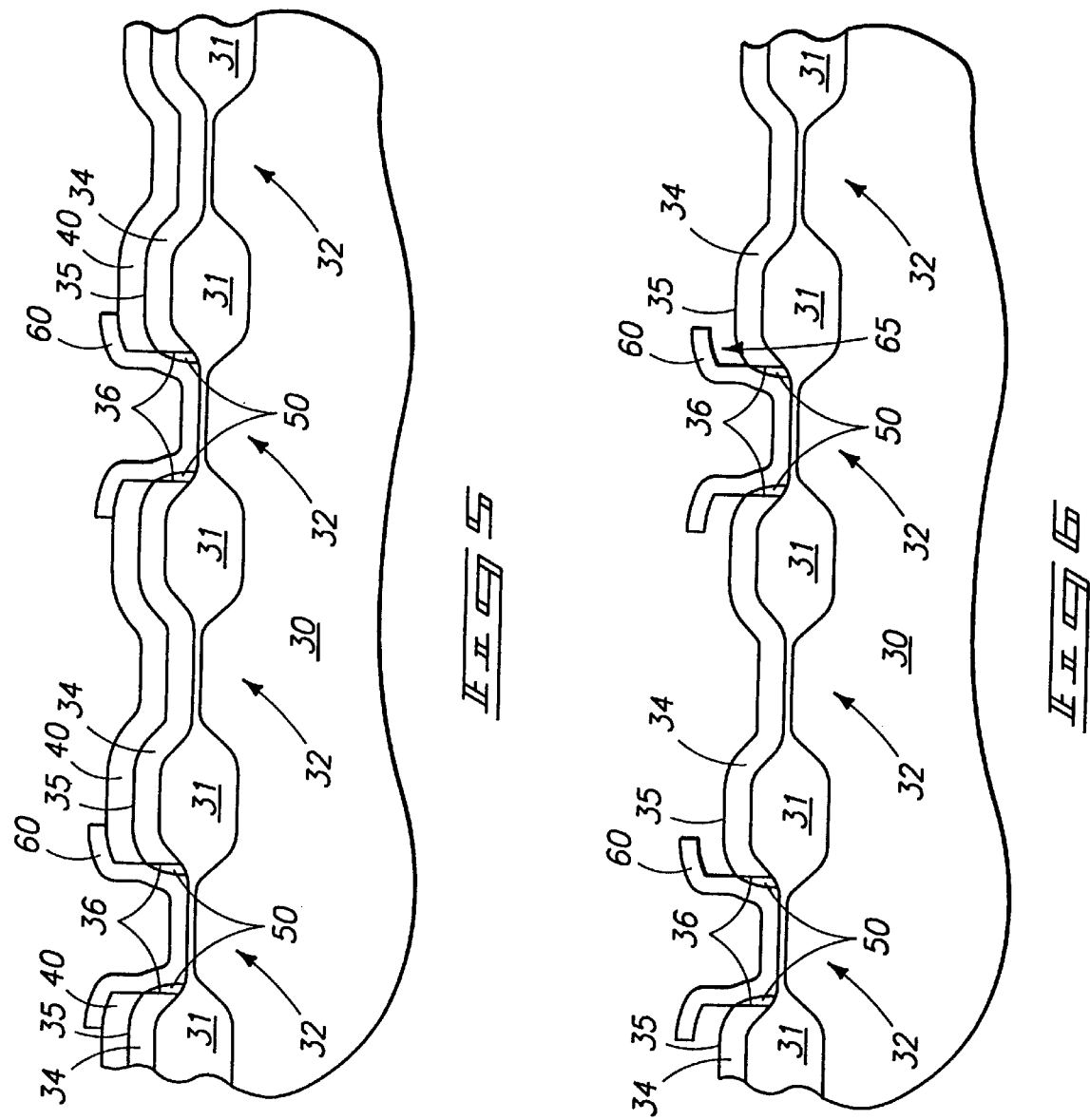

HIGH DENSITY FLASH MEMORY CELL AND METHOD OF FORMING A LINE OF FLOATING GATE TRANSISTORS

RELATED PATENT DATA

This is a continuation of Ser. No. 08/748,102 filed Nov. 12, 1996, and now U.S. Pat. No. 5,721,441, which is a division of Ser. No. 08/675,993, filed Jul. 9, 1996, and now U.S. Pat. No. 5,658,814.

TECHNICAL FIELD

The present invention relates to digital memory cells and more particularly to high density structures in metal oxide semiconductor (MOS) flash memory cells.

BACKGROUND OF THE INVENTION

As computers become increasingly complex, the need for memory storage, and in particular memory cells, increases. At the same time, there is the need to minimize the size of computers. Moreover, with advent of laptop computers and other devices requiring low power usage, the amount of power consumed by a memory cell becomes critical, as the power consumed by a memory cell affects the length of time between recharging of the batteries used with same. In order to optimize both needs, the memory cells of the computer must, by necessity, be made smaller and more energy efficient.

A memory cell stores one bit of information. Bits are commonly represented by the binary digits 0 and 1. A single computer can store millions or even billions of bits.

A conventional non-volatile semiconductor memory device in which contents are electrically programmable and simultaneously erased by one operation (hereinafter called "flash memory") includes a plurality of memory cells each provided with a floating gate covered with an insulating layer. There is also a control gate which overlays the insulating layer. The insulating layer is often termed the interpoly oxide layer. Below the floating gate is another insulating layer sandwiched between the floating gate and the substrate. The substrate contains the doped source and drain regions. A channel region is disposed between the source and drain regions.

In flash memory, a charged floating gate is one logic state, typically represented by the binary digit 1, while a non-charged floating gate is the opposite logic state typically represented by the binary digit 0. Charges are injected or written to a floating gate by any number of methods, including avalanche injection, channel injection, Fowler-Nordheim tunneling, and channel hot electron injection, for example. The floating gate is discharged or erased by any number of methods including Fowler-Nordheim tunneling, for example.

During the write operation, the control gate is set at a high voltage, 12 volts, for example. The drain is also set at a high voltage usually around 6 volts. The source is kept at 0 volts or ground. With these voltage levels, electrons are trapped in the floating gate, thus leaving it in a charged state.

The erasing or discharging operation is typically accomplished by applying a relatively high voltage (approximately 12 volts) to the source of the cell while the gate is grounded, and the drain region is usually floating.

It is desired that the charging and discharging of the floating gate be accomplished by voltages lower than those used in the prior art. If lower voltages are used, then the power consumed by the charging and discharging of a memory cell is reduced.

One way to lower the voltages for writing and erasing is to increase the coupling between the control gate (also known as the wordline layer) and the floating gate. Coupling refers to the relationship between the voltage on the control gate and the voltage on the floating gate. The better the floating gate voltage coincides with the control gate voltage, the better the coupling.

For example, if a voltage $V_m$ is applied to the control gate, one obtains the voltage $V_f$ on the floating gate by calculating the coupling factor $\gamma$ which associates those two voltages according to the relation: $V_f=\gamma \times V_m$. Therefore, an increase in the coupling factor $\gamma$ is an increase in coupling which in turn allows charging and discharging with lower voltages than a cell with a lower $\gamma$ coupling factor.

The coupling factor ($\gamma$) is thus the ratio of capacitance between the floating gate and the control gate to the sum of the capacitance between the floating gate and the control gate plus all capacitances between the floating gate and the substrate. Therefore, it can be increased by reducing the capacitance between the floating gate and the substrate.

One prior art attempt at increasing the coupling has been to use rough polycrystalline silicon for the floating gate. However, this method, while effective, can cause undesirable processing difficulties. For example, as the size of memory cells have decreased, the use of rough polysilicon has had a propensity for occluding contact openings and causing other similar problems.

Another prior art solution to the coupling problem has been to use a CMP cell. While this structure has resulted in improved coupling efficiency, it is, however, a very complicated structure. Further, it is difficult to integrate with other peripheral devices.

Still further, as the geometries of memory cells have steadily decreased, designers and fabricators have sought after a means by which the capacitance and coupling efficiency of a memory cell could be easily increased, without correspondingly increasing the size of the memory cell.

A high density flash memory cell and method for forming a line of floating gate transistors is the subject matter of the present invention.

BRIEF DESCRIPTION OF THE DRAWINGS

Preferred embodiments of the invention are described below with reference to the following accompanying drawings.

FIG. 3 is a transverse, vertical, sectional view taken through a flash memory cell of the present invention at one step in the manufacturing of same.

FIG. 4 is a transverse, vertical, sectional view of a flash memory cell of the present invention taken at a processing step subsequent to that shown in FIG. 3.

FIG. 5 is a transverse, vertical, sectional view of a flash memory cell of the present invention taken at a processing step subsequent to that shown in FIG. 4.

FIG. 6 is a transverse, vertical, sectional view of a flash memory cell of the present invention taken at a processing step subsequent to that shown in FIG. 5.

DETAILED DESCRIPTION OF THE PREFERRED EMBODIMENTS

Figure 1:
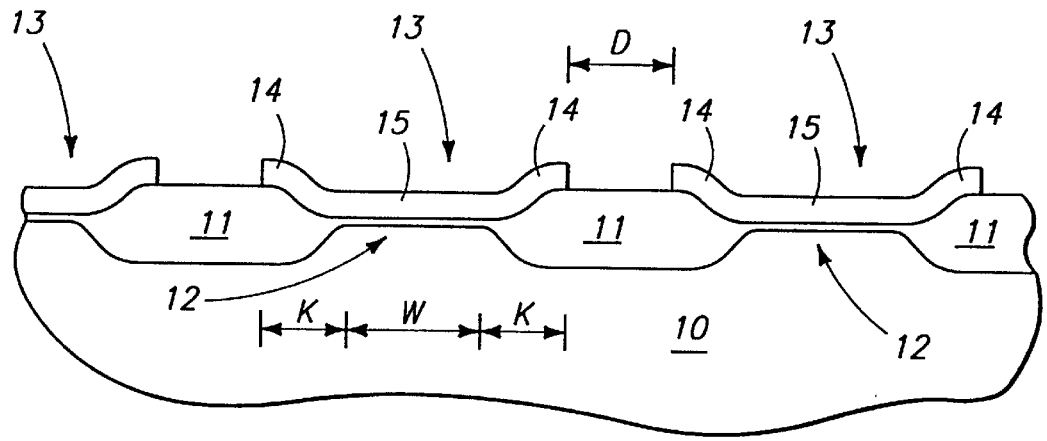
FIG. 1 is a transverse, vertical, sectional view taken from a position along line 1—1 of FIG. 2 and which illustrates a flash memory cell of conventional design.

This disclosure of the invention is submitted in furtherance of the constitutional purposes of the U.S. Patent Laws "to promote the progress of science and useful arts" (Article 1, Section 8).

One aspect of the present invention is to provide a method for forming a line of floating gate transistors, comprising:

providing a substrate having a plurality of discreet field oxide regions, and intervening active area regions therebetween;

forming a first alternating series of floating gates over a first alternating series of active area regions;

forming a second alternating series of floating gates over a second alternating series of active area regions, the second alternating series of floating gates disposed in spaced, overlapping and partial covering relation relative to the first alternating series of floating gates;

forming a layer of dielectric material over the first and second series of floating gates; and forming a control gate layer of electrically conductive material over the layer of dielectric material.

Another aspect of the present invention relates to a method for forming a line of at least two floating gate transistors, comprising:

providing a substrate having an active area region and an adjacent field oxide region;

forming a first floating gate over the active area region and a second floating gate over the field oxide region, the first and second floating gates being spaced from one another, at least a portion of the first or second floating gates overlying at least a portion of the other of the first or second floating gates; and forming a control gate line over the first and second floating gates.

Still a further aspect of the present invention relates to a line of floating gate transistors; a memory chip having a line of floating gate transistors; and a die having a line of floating gate transistors, comprising:

a substrate having a plurality of discrete field oxide regions disposed in spaced relation relative to one another, and active area regions therebetween;

a plurality of first floating gates individually disposed over alternating active area regions, and substantially covering adjacent field oxide regions, the individual floating gates each having sidewalls;

a plurality of second floating gates individually disposed over an alternating series of active area regions and the adjoining field oxide regions, the second floating gates disposed in spaced relation relative to the first floating gates, and at least a portion of the second floating gates disposed in overlying, spaced relation relative to the first floating gates;

a layer of electrically insulative material disposed in covering relation relative to the sidewalls of the first floating gates;

a layer of dielectric material disposed in covering relation relative to the first and second floating gates; and a control gate layer disposed in covering relation relative to the layer of dielectric material.

Still a further aspect of the present invention relates to a memory chip having a line of floating gate transistors comprising:

a substrate having a plurality of discreet field oxide regions and intervening active area regions therebetween, the field oxide and active area regions located along a given line, and wherein the length of the individual active area regions along the given line is substantially equal to the variable W;

a first alternating series of floating gates positioned over a first alternating series of active area regions, and wherein the distance of separation between adjacent first floating gates along the given line is substantially equal to the variable D;

a second alternating series of floating gates positioned over a second alternating series of active area regions;

a layer of dielectric material positioned over the first and second series of floating gates; and a control gate layer positioned over the layer of dielectric material, and wherein W+D substantially equals the column pitch of the floating gates along the given line.

Figure 2:
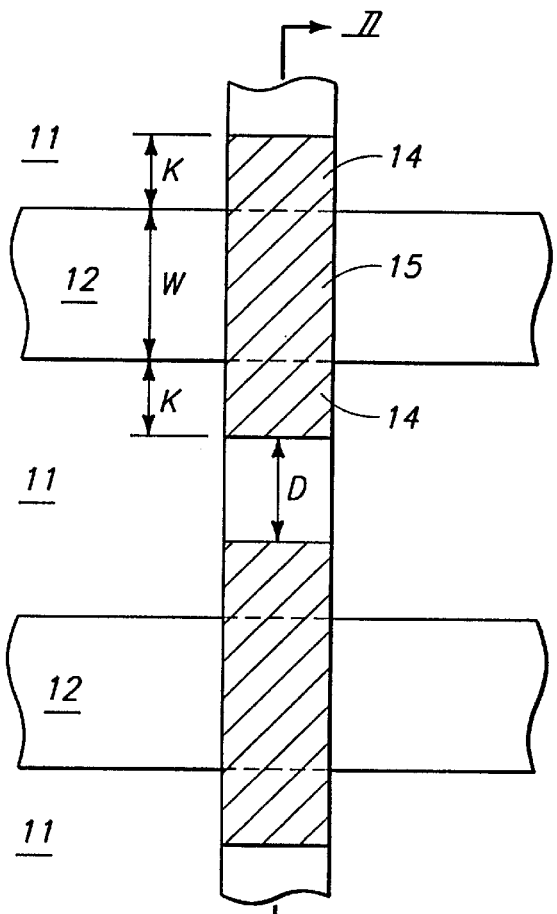
FIG. 2 is a top plan view of the prior art flash memory cell as shown in FIG. 1.
Figure 7:
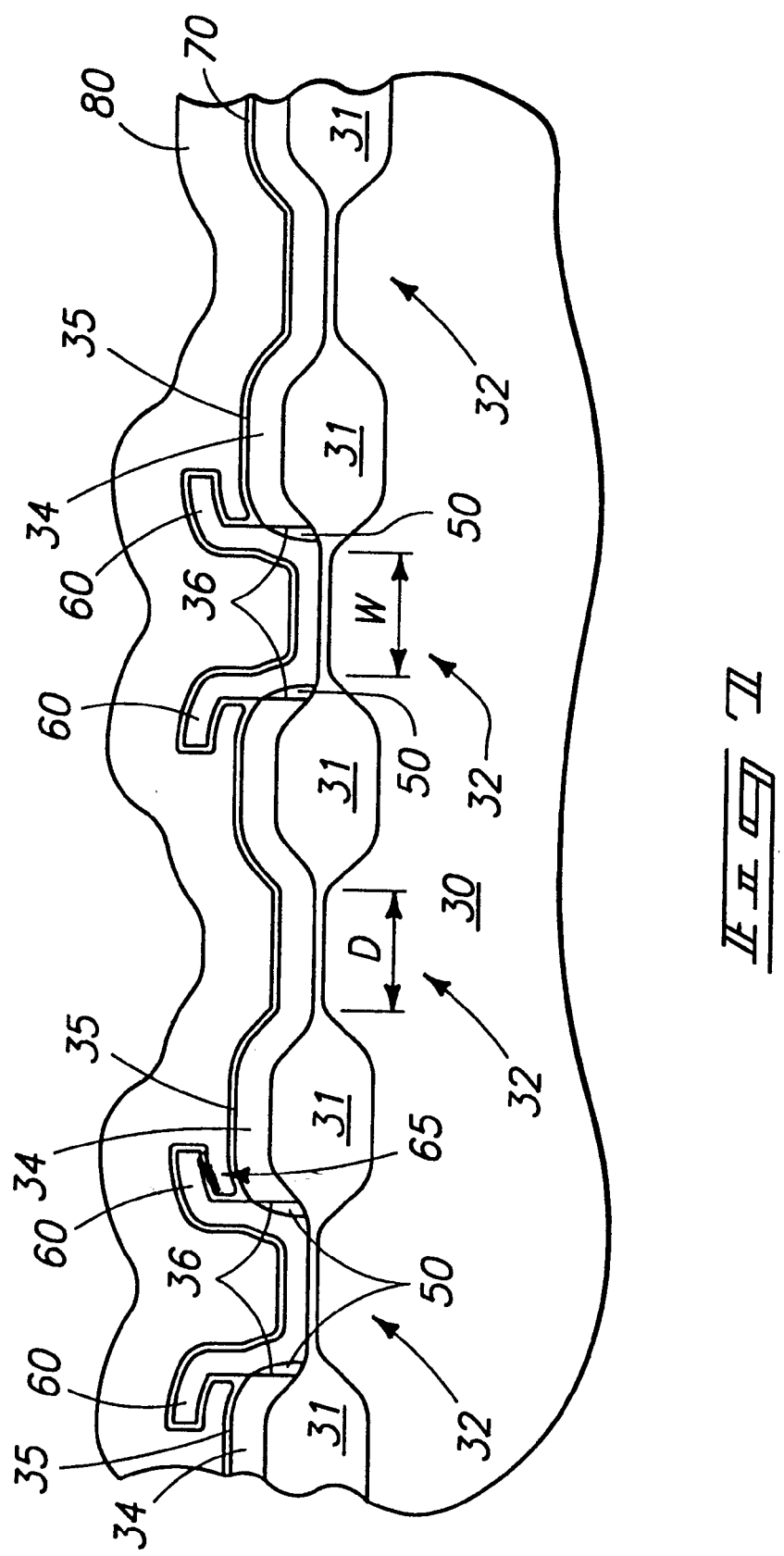
FIG. 7 is a transverse, vertical, sectional view of a flash memory cell of the present invention taken at a processing step subsequent to that shown in FIG. 6.

Referring now to FIGS. 1 and 2, a line of prior art memory cells are shown, as formed, on a bulk substrate 10. The bulk substrate 10 has field oxide regions 11 which are disposed in predetermined, spaced relation one to another. Active area regions 12 are provided between the field oxide regions. A series of patterned floating gates 13 are provided. The respective floating gates 13 overlie a portion of two immediately adjacent field oxide regions 11 and the active area region 12 therebetween. The floating gates 13 include portions 14 which slope upwardly along the field oxide region 11. These portions 14 are received along a given distance K. The portion 15 of the floating gate layer 13 is received in covering relation relative to the active area region 12 along a distance W. The distance of separation between adjacent floating gate 13 is represented by the variable D. Accordingly, the column pitch of prior art floating gate memory cells can be represented by the formula W+2K+D. In conventional flash cell construction, W is equal to about 0.7 $\mu$m; K is equal to about 0.7 $\mu$m and D is equal to about 0.54 $\mu$m. Therefore, the column pitch of a conventional memory cell equals approximately 2.64 $\mu$m. In the preferred embodiment of the present invention, as seen in FIG. 7, the cell column pitch equals W+D because the adjacent floating gates overlap one another by the previous distance K. Accordingly, where W equals 0.7 $\mu$m and D equals 0.54, a preferred column pitch in memory cells of the present invention equals about 1.24 $\mu$m. This represents a memory cell area which is less than one half the size of the conventional prior art memory cells.

Referring now to FIG. 3, a bulk substrate 30 in process is shown. Such includes a plurality of discrete field oxide regions 31, which are disposed in predetermined spaced relation, one to another. Intervening active area regions 32a/32b are provided therebetween. A first layer of electrically conductive material, preferably polysilicon, is provided and patterned to define a first alternating series of floating gates 34. The first floating gates 34 are formed over a first alternating series of the intervening active area regions 32a. The first alternating series of floating gates 34 have an exterior facing, or top surface 35, and sidewalls 36. As seen in FIG. 3, the first alternating series of floating gates 34 are provided over a substantial portion (more than ½) of the two immediately adjacent field oxide regions 31 over which they lie.

Prior to the patterning to produce floating gates 34, a sacrificial material layer 40 is formed atop the floating gate layer. Such is patterned and etched, along with the floating gate layer, to form sacrificial material 40 disposed in covering relation relative to the top surface 35 of each of the alternating series of first floating gates 34. The layer of sacrificial material 40 is most preferably highly selectively etchable relative to the underlying first floating gate 35. Preferred sacrificial materials are nitride or oxide.

Referring now to FIG. 4, the bulk substrate 30 is exposed to conditions effective to cause the growth of oxide 50 on the sidewalls 36 of the alternating series of first floating gates 34. Example oxide growth conditions include wet oxidation conditions. The oxide 50 substantially electrically insulates the electrically conductive sidewalls 36 of the first alternating series of floating gates 34.

Referring now to FIG. 5, and after electrically insulating the conductive sidewalls 36 by providing the electrically insulative layer 50 thereover, a second layer of electrically conductive material (preferably polysilicon) is provided and patterned to define a second alternating series of floating gates 60. The second alternating series of floating gates 60 are provided over the sacrificial material layer 40 and over a second series of active area regions 32b and between the first floating gates 34. The second alternating series of floating gates 60 are disposed in spaced, partial covering relation relative to the first floating gates 34. Further, the first and second floating gates are spaced from each other such that at least a portion of one of the first or second floating gates overlies at least a portion of the other of the first and second floating gates. In accordance with the above terminology and depicted embodiment, floating gates 60 overlie floating gates 34.

Referring now to FIG. 6, and following the provision of the second alternating series of floating gates 60, the sacrificial material layer 40 is selectively etched from between the first and second floating gates 34 and 60 to define an elevational void 65, therebetween.

Referring now to FIG. 7, a layer of dielectric material 70 is formed over the first and second alternating series of floating gates 34 and 60, respectively. The layer of dielectric material 70 preferably comprises a composite oxide-nitride-oxide layer. A control gate layer 80, preferably comprising polysilicon, is then formed over the layer of dielectric material 70, and over the first and second floating gates 34 and 60, respectively, and is patterned to effectively form a line of floating gates.

The construction, shown in FIG. 7, results in a memory chip and/or a resulting die having a line of floating gate transistors formed thereon, the die or memory chip comprising, a substrate 30 having a plurality of field oxide regions 31 disposed in spaced relation relative to one another, and active area regions 32 therebetween; a plurality of first floating gates 34 individually disposed over alternating active area regions 32, and substantially covering adjacent field oxide regions 31, the individual first floating gates 34 each having sidewalls 36; a plurality of second floating gates 60 individually disposed over an alternating series of active area regions 32, and the adjoining field oxide regions 31, the second floating gates 60 disposed in spaced relation relative to the first floating gates 34, and at least a portion of the second floating gates 60 disposed in overlying spaced relation relative to the first floating gate 34; a layer of electrically insulative material 50 provided over the sidewalls 36 of the first floating gate 34; a layer of dielectric material 70 provided atop the first and second floating gates 34 and 60; and a control gate layer 80 provided over the layer of dielectric material 70.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the Doctrine of Equivalents.

I claim:

1. A pair of floating gate transistors comprising:

a substrate comprising a field oxide region and adjacent active area region, the field oxide region including a bird's beak region extending towards the active area region;

a first floating gate overlying at least a portion of the field oxide region;

a second floating gate overlying the active area region, the second floating gate including a portion which is spaced from and overlying relative to the first floating gate, the second floating gate portion overlying the first floating gate over the field oxide bird's beak region; and a control gate line formed over the first and second floating gates.

2. A pair of floating gate transistors comprising:

a substrate comprising a field oxide region and adjacent active area region;

a first floating gate overlying at least a portion of the field oxide region;

a second floating gate overlying the active area region, the second floating gate including a portion which is spaced from and overlying relative to the first floating gate and forming an elevational void therebetween; and a control gate line formed over the first and second floating gates, material of the control gate line being received within the elevational void.

3. A pair of floating gate transistors comprising:

a substrate comprising a field oxide region and adjacent active area region;

a first floating gate overlying at least a portion of the field oxide region;

a second floating gate overlying the active area region, the second floating gate including a portion which is spaced from and overlying relative to the first floating gate and forming an elevational void therebetween;

a control gate line formed over the first and second floating gates; and a layer of dielectric material formed over and in contact with the first and second floating gates intermediate said floating gates and control gate line, the layer of dielectric material not filling the elevational void.

4. A pair of floating gate transistors comprising:

a substrate comprising a field oxide region and adjacent active area region;

a first floating gate overlying more than one-half of the field oxide region;

a second floating gate overlying the active area region, the second floating gate being spaced from and overlying relative to the first floating gate over the field oxide region, the second floating gate overlying less than one-half of the field oxide region; and a control gate line formed over the first and second floating gates.

5. A pair of floating gate transistors comprising:
- a substrate comprising a field oxide region and adjacent active area regions on opposing sides thereof, the field oxide region including opposing bird's beak regions extending towards the respective active area region;
- a first floating gate overlying one of the active area regions and both of said bird's beak regions;
- a second floating gate overlying the other active area region, the second floating gate being spaced from and overlying relative to the first floating gate over the field oxide region; and
- a control gate line formed over the first and second floating gates.

6. The pair of floating gate transistors of claim 5 wherein the second floating gate overlies only one of the bird's beak regions.

7. A line of floating gate transistors, comprising:
- a substrate having a plurality of discrete field oxide regions disposed in spaced relation relative to one another, and active area regions therebetween;
- a plurality of first floating gates comprising polysilicon individually disposed over alternating active area regions, and covering more than one-half of the immediately adjacent field oxide regions, over which they lie the individual floating gates each having sidewalls;
- a plurality of second floating gates comprising polysilicon individually disposed over an alternating series of active area regions and the adjoining field oxide regions, the second floating gates disposed in spaced relation relative to the first floating gates, and at least a portion of the second floating gates disposed in overlapping, spaced relation, relative to the first floating gates;
- a layer of electrically insulative material disposed in covering relation relative to the sidewalls of the first floating gates;
- a layer of dielectric material comprising oxide and nitride materials disposed in covering relation relative to the first and second floating gates; and
- a control gate layer comprising polysilicon disposed in covering relation relative to the layer of dielectric material.

\* \* \* \* \*